(12) United States Patent
Zur (10) Patent No.: US 12,230,473 B2
(45) Date of Patent: Feb. 18, 2025

(54) TEMPERATURE-CONTROLLED SURFACE WITH A CRYO-NANOMANIPULATOR FOR IMPROVED DEPOSITION RATE

(71) Applicant: Applied Materials Israel Ltd., Rehovot (IL)

(72) Inventor: Yehuda Zur, Tel-Aviv (IL)

(73) Assignee: Applied Materials Israel Ltd., Rehovot (IL)

( * ) Notice: Subject to any disclaimer, the term of this patent is extended or adjusted under 35 U.S.C. 154(b) by 699 days.

(21) Appl. No.: 17/385,459

(22) Filed: Jul. 26, 2021

(65) Prior Publication Data
US 2023/0023396 A1    Jan. 26, 2023

(51) Int. Cl.
*H01J 37/317*    (2006.01)
*C23C 16/16*    (2006.01)
(Continued)

(52) U.S. Cl.
CPC .......... *H01J 37/3178* (2013.01); *C23C 16/16* (2013.01); *C23C 16/486* (2013.01);
(Continued)

(58) Field of Classification Search
CPC .... H01J 37/3178; H01J 37/1474; H01J 37/20; H01J 37/28; H01J 2237/002;
(Continued)

(56) References Cited

U.S. PATENT DOCUMENTS 6,492,261 B2    12/2002    Gavish et al.
8,604,446 B2    12/2013    Ditto
(Continued)

FOREIGN PATENT DOCUMENTS

DE    102014220122 A1 *    4/2016    ............ H01J 37/023

OTHER PUBLICATIONS

Li, et al., "Study of Temperature Influence on Electron Beam Induced Deposition", J. Vac. Sci. Technol. A, vol. 24, No. 3, May/Jun. 2006, pp. 431-436.
(Continued)

*Primary Examiner* — Georgia Y Epps
*Assistant Examiner* — Don J Williams
(74) *Attorney, Agent, or Firm* — Kilpatrick Townsend & Stockton LLP (57) ABSTRACT

A method of depositing material over a sample in a deposition region of the sample with a charged particle beam column, the method comprising: positioning a sample within a vacuum chamber such that the deposition region is under a field of view of the charged particle beam column; cooling the deposition region by contacting the sample with a cyro-nanomanipulator tool in an area adjacent to the deposition region; injecting a deposition precursor gas into the vacuum chamber at a location adjacent to the deposition region; generating a charged particle beam with a charged particle beam column and focusing the charged particle beam on the sample; and scanning the focused electron beam across the localized region of the sample to activate molecules of the deposition gas that have adhered to the sample surface in the deposition region and deposit material on the sample within the deposition region.

20 Claims, 5 Drawing Sheets

(51) Int. Cl.
    *C23C 16/48* (2006.01)
    *H01J 37/147* (2006.01)
    *H01J 37/20* (2006.01)
    *H01J 37/28* (2006.01)
    *H01L 21/285* (2006.01)

(52) U.S. Cl.
    CPC .......... *H01J 37/1474* (2013.01); *H01J 37/20* (2013.01); *H01J 37/28* (2013.01); *H01L 21/28568* (2013.01); *H01J 2237/002* (2013.01); *H01J 2237/20285* (2013.01); *H01J 2237/31732* (2013.01)

(58) Field of Classification Search
    CPC .. H01J 2237/20285; H01J 2237/31732; H01L 21/28568
    See application file for complete search history.

(56) References Cited

U.S. PATENT DOCUMENTS

| | | |
|---|---|---|
| 2007/0134866 A1 | 6/2007 | Huang et al. |
| 2008/0111069 A1* | 5/2008 | Notte ................ G01N 23/2255 250/282 |
| 2009/0323287 A1 | 12/2009 | Patterson |
| 2010/0219339 A1 | 9/2010 | Ogawa et al. |
| 2017/0073814 A1* | 3/2017 | Bishop ................ H01J 37/3178 |
| 2017/0200589 A1 | 7/2017 | Chandler |
| 2017/0330722 A1 | 11/2017 | Agemura |
| 2022/0172921 A1* | 6/2022 | Den Hoedt ............. H01J 37/20 |

OTHER PUBLICATIONS

Utke, et al., "Nanofabrication Using Focused Ion and Electron Beams; Principles and Applications", Oxford University Press, Nanomanufacturing series; v. 1, ISBN 978-0-19-973421-4, 2012, pp. 1-56.

PCT/US2022/036530, "International Search Report and Written Opinion", Oct. 28, 2022, 9 pages.

PCT/US2022/036530, "International Preliminary Report on Patentability", Feb. 8, 2024, 6 pages.

* cited by examiner

TEMPERATURE-CONTROLLED SURFACE WITH A CRYO-NANOMANIPULATOR FOR IMPROVED DEPOSITION RATE

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen such as a silicon, gallium nitride or other type of wafer that includes one or more integrated circuits (ICs) or other electronic structures formed thereon can be milled with a focused ion beam (FIB) and/or analyzed with a scanning electron microscope (SEM) to study specific characteristics of the circuits or other structures formed on the wafer.

FIB and SEM tools are similar in that each includes a charged particle column that generates a charged particle beam and directs the beam towards a sample. As their names imply, however, the charged particle beam generated by an FIB column is a focused beam of ions while the charged particle beam generated by an SEM column is a focused beam of electrons.

While FIB and SEM tools (as well as FIB-SEM tools, which include both a FIB column and a SEM column) are often used for analyzing and otherwise evaluating structures within a specimen, the tools can also be used for etching or depositing material on a specimen. For example, a focused ion beam can be scanned across a surface of a sample while a gas injection system directs a flow of a deposition precursor gas to the scanned area to selectively deposit material, with nanometer precision, in the scanned area according to a technique that is often referred to as focused ion beam enhanced deposition or FIB-enhanced deposition for short. During a FIB-enhanced deposition process, molecules of the injected gas adhere to a surface of the sample. As the ion beam is scanned across a region of the sample, the energy released by the collision cascade of the bombarding ions causes dissociation of the surface-adsorbed precursor molecules, resulting in sold deposition on the surface together with the release of volatile residues.

While FIB-enhanced deposition has been used in many different instances and applications, improved deposition techniques are continuously being sought.

BRIEF SUMMARY OF THE INVENTION

Embodiments of the disclosure pertain to an improved method and system for charged particle beam enhanced deposition, such as focused ion beam enhanced deposition. Embodiments can be used to increase the deposition rate of charged particle beam enhanced deposition and thereby increase the throughput of processes that employ charged particle beam enhanced deposition. While embodiments of the disclosure can be used to increase the rate at which materials are deposited over a variety of different types of samples, some embodiments are particularly useful in depositing materials over samples that are semiconductor wafers or similar specimens.

In some embodiments, a method of depositing material over a sample is provided. The method can include: positioning a sample within a vacuum chamber such that the deposition region is under a field of view of the charged particle beam column; cooling the deposition region by contacting the sample with a cyro-nanomanipulator tool in an area adjacent to the deposition region; injecting a deposition precursor gas into the vacuum chamber at a location adjacent to the deposition region; generating a charged particle beam with a charged particle beam column and focusing the charged particle beam on the sample; and scanning the focused electron beam across the localized region of the sample to activate molecules of the deposition gas that have adhered to the sample surface in the deposition region and deposit material on the sample within the deposition region.

Various implementations of the embodiments described herein can include one or more of the following features. The method can further include, after the scanning step, moving the sample such that a new, different deposition region of the sample is positioned under the field of view of the charged particle beam column and repeating the steps of cooling, injecting, generating and scanning to deposit material on the sample within the new deposition region. The cyro-nanomanipulator can include an inner ring and the generating and scanning steps can direct the charged particle beam through the inner ring of the cyro-nanomanipulator. The charged particle column can be a focused ion beam column and the charged particle beam can be an ion beam. The ion beam can comprise xenon ions. The ion beam can have a diameter between 0.5 and 25 microns. The vacuum chamber can be a chamber in a FIB-SEM tool and the charged particle column can be one of a focused ion beam column or a scanning electron microscope column. The sample can be a semiconductor wafer.

Some embodiments pertain to a non-transitory computer-readable medium that stores computer-readable instructions for controlling a sample processing system to deposit material over a sample in a localized region of the sample. The instructions can cause the system to: position a sample within a vacuum chamber such that the deposition region is under a field of view of the charged particle beam column; cool the deposition region by contacting the sample with a cyro-nanomanipulator tool in an area adjacent to the deposition region; inject a deposition precursor gas into the vacuum chamber at a location adjacent to the deposition region; generate a charged particle beam with a charged particle beam column and focusing the charged particle beam on the sample; and scan the focused electron beam across the localized region of the sample to activate molecules of the deposition gas that have adhered to the sample surface in the deposition region and deposit material on the sample within the deposition region Some embodiments pertain to a system for depositing material over a sample in a localized region of the sample. The system can include: a vacuum chamber; a sample support configured to hold a sample within the vacuum chamber during a sample evaluation process; a charged particle beam column configured to direct a charged particle beam into the vacuum chamber toward the sample, the SEM column including an electron gun at one end of the column and a column cap at an opposite end of the column; a cyro-nanomanipulator; and a processor and a memory coupled to the processor. The memory can include a plurality of computer-readable instructions that, when executed by the processor, cause the system to: position a sample within a vacuum chamber such that the deposition region is under a field of view of the charged particle beam column; cool the deposition region by contacting the sample with a cyro-nanomanipulator tool in an area adjacent to the deposition region; inject a deposition precursor gas into the vacuum chamber at a location adjacent to the deposition region; generate a charged particle beam with a charged particle beam column and focusing the charged particle beam on the sample; and scan the focused electron beam across the localized region of the sample to activate molecules of the deposition gas that have adhered to the sample surface in the deposition region and deposit material on the sample within the deposition region To better understand the nature and advantages of the present disclosure, reference should be made to the following description and the accompanying figures. It is to be understood, however, that each of the figures is provided for the purpose of illustration only and not drawn to scale and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments of the disclosure pertain to an improved method and system for particle beam enhanced deposition, such as focused ion beam enhanced deposition. Embodiments can be used to increase the deposition rate of particle beam enhanced deposition and thereby increase the throughput of processes that employ particle beam enhanced deposition.

Example Sample Evaluation System

Figure 1:
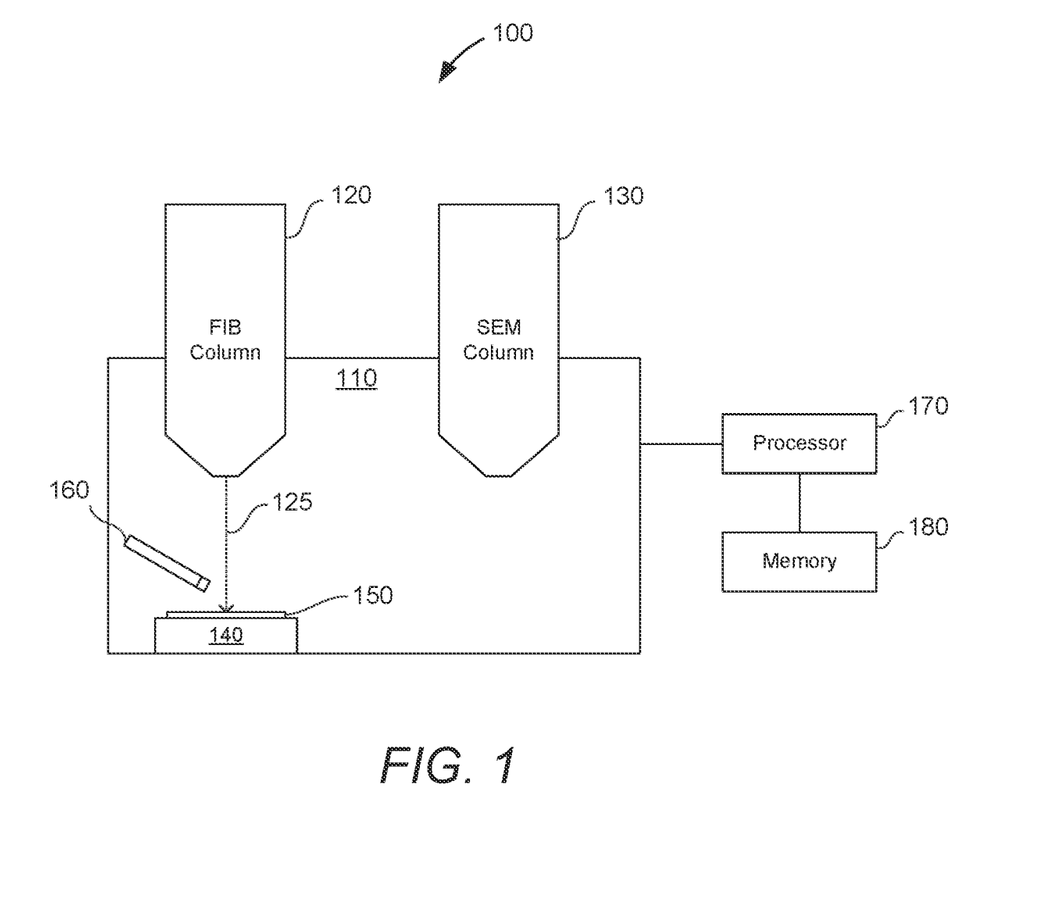
FIG. 1 is simplified schematic illustration of a sample particle beam deposition system.

In order to better understand and appreciate the disclosure, reference is first made to FIG. 1, which is a simplified schematic illustration of a substrate processing system suitable for depositing material over a sample in accordance with some embodiments of the disclosure. Substrate processing system 100 can be used for, among other operations, particle enhanced deposition of various materials over semiconductor wafers.

Substrate processing system 100 can include a vacuum chamber 110 along with a a focused ion beam (FIB) column 120 and a scanning electron microscope (SEM) column 130. A supporting element 140 can support a sample 150 (e.g., a semiconductor wafer) within chamber 110 during a processing operation in which the sample 150 (sometimes referred to herein as an "object" or a "specimen") is subject to a charged particle beam from one of the FIB or SEM columns 120, 130 and can move the sample within vacuum chamber 110 between the field of view of the two columns 120 and 130 as required for processing.

During a processing operation, one or more gases can be delivered into chamber 110 by a gas injection system 160 for certain operations. For simplicity of explanation gas injection system 160 is illustrated in FIG. 1 as a nozzle, but it is noted that gas injection system 160 can include gas reservoirs, gas sources, valves, one or more inlets and one or more outlets, among other elements. In some embodiments gas injection system 160 can be configured to deliver gas to a localized area of sample 150 that is exposed to the scan pattern of the charged particle beam as opposed to delivering gas to an entire upper surface of the sample. For example, in some embodiments gas injection system 160 has a nozzle diameter measured in hundreds of microns (e.g., between 400-500 microns) that is configured to deliver gas directly to a relatively small portion of the sample's surface that encompasses the charged particle beam scan pattern. In various embodiments, a first gas injection system 160 can be configured to deliver gas to a sample disposed under FIB column 120 and a second gas injection system 160 can be configured to deliver gas to a sample disposed under SEM column 130.

FIB column 120 and SEM column 130 are connected to vacuum chamber 110 so that a charged particle beam generated by either one of the charged particle columns propagates through a vacuumed environment formed within vacuum chamber 110 before impinging on sample 150. For example, as shown in FIG. 1, FIB column 120 can generate a focused ion beam 125 that travels through the vacuum environment of chamber 110 before colliding with sample 150.

FIB column 120 can mill (e.g., drill a hole in) sample 150 by irradiating the sample with one or more charged particle beams to form a cross section and can also smooth the cross section. The cross section can include one or more first portions of a first material and one or more second portions of a second material. The cross section can also include additional portions of other materials. Conveniently, the smoothing operation involves utilizing smaller acceleration voltages in relation to the milling of the sample. SEM column 130 can generate an image of a portion of sample 150 by illuminating the sample with a charged particle beam, detecting (e.g., with an appropriate detector not shown in FIG. 1) particles emitted due to the illumination and generating charged particle images based on the detected particles.

The particle imaging and milling processes each typically include scanning a charged particle beam back-and-forth (e.g., in a raster scan pattern) at a constant rate across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns.

As shown in FIG. 1, system 100 can include one or more controllers, processors or other hardware units 170 that control the operation of system 100 by executing computer instructions stored in one or more computer-readable memories 180 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Charged Particle Enhanced Deposition Process

Some embodiments of the disclosure can deposit material over a sample positioned on support 150 by initiating a deposition process under high-energy charged particle beam of one of the charged particle columns 120 or 130. As an example, in some embodiments FIB column 120 can be used in a deposition mode to initiate a focused ion beam enhanced deposition process. Towards this end, a deposition gas can be supplied to the sample 150 by gas injection system 160 and energy from the FIB column 120 can generate a beam of ions. The cascade of impinging ions can, in turn, activate the deposition gas resulting in deposition of material on the sample that is localized to the regions of the sample that over which the ion beam is scanned. Thus, deposition that occurs according to such embodiments does not simultaneously occur across the entire surface of the sample or wafer being processed. Instead, deposition occurs only in the general areas where the ion beam (which, as a non-limiting example, can have a diameter in the range of 0.5 to 25 microns for a xenon plasma) impinges upon the wafer and as the ion beam is scanned across those areas of the wafer. Thus, deposition according to some embodiments can be carried out with micron level resolution.

The rate at which material is deposited in a charged particle beam enhanced deposition process can have a direct impact on the throughput of the process. Thus, higher deposition rates can equate to a higher throughput. During a charged particle beam deposition process, the rate at which material is deposited over the sample depends on a number of different factors including the energy level of the charged particle beam, the precursor gas used for the deposition process, the type of material on the surface of the sample and the temperature of the sample surface. For example, in a charged particle beam enhanced deposition process, the molecular sticking coefficient is one of the parameters that governs deposition rate. The sticking coefficient is a measure of the probability of an airborne molecule to stick to the surface of a sample upon contact. The deposition rate of a charged particle beam enhanced deposition process increases with an increase of the deposition gases sticking coefficient. For some precursor gases the sticking coefficient is inversely dependent on temperature. That is, an increase in temperature decreases the sticking coefficient while a decrease in temperature increases the sticking coefficient.

In contrast to the sticking coefficient, the diffusion coefficient increases with increased temperature and decreases with decreased temperature. For example, as a charged particle beam solidifies material in the scanned area, the area becomes depleted of molecules of the precursor gas. Under the diffusion principle, new precursor gas molecules will want to replace the solidified molecules but the cooler sample means slower diffusion and thus slower replacement of the depleted precursor gas molecules. Thus, while lowering the sample temperature can improve the sticking coefficient and increase deposition rate, it can also reduce the diffusion coefficient which undesirably lowers the deposition rate potentially reducing some of the benefit obtained by lowering the sample temperature.

Increasing the Deposition Rate of a Charged Particle Enhanced Deposition Process In some deposition processes higher deposition rates can be obtained at lower sample surface temperatures. In order to promote a higher deposition rate, and thus a higher throughput rate, some embodiments of the disclosure can include a cyro-nanomanipulator to lower the temperature of a localized region of the sample in which charged particle enhanced deposition is performed. For example, reference is made to FIG. 2, which is a simplified schematic illustration of a substrate processing system 200 in accordance with some embodiments of the disclosure. Substrate processing system 200 can include many of the same components discussed above with respect to substrate processing system 100 and, for convenience of discussion, like elements are depicted with the same reference number as used in FIG. 1 and not discussed further herein. Additionally, for convenience, system 200 is shown without a controller/processor and memory but it is to be understood that, similar to system 100, system 200 can include one or more controllers, processors or other hardware units that control the operation of system 100 by executing computer instructions stored in one or more computer-readable memories as would be known to persons of ordinary skill in the art.

Figure 2:
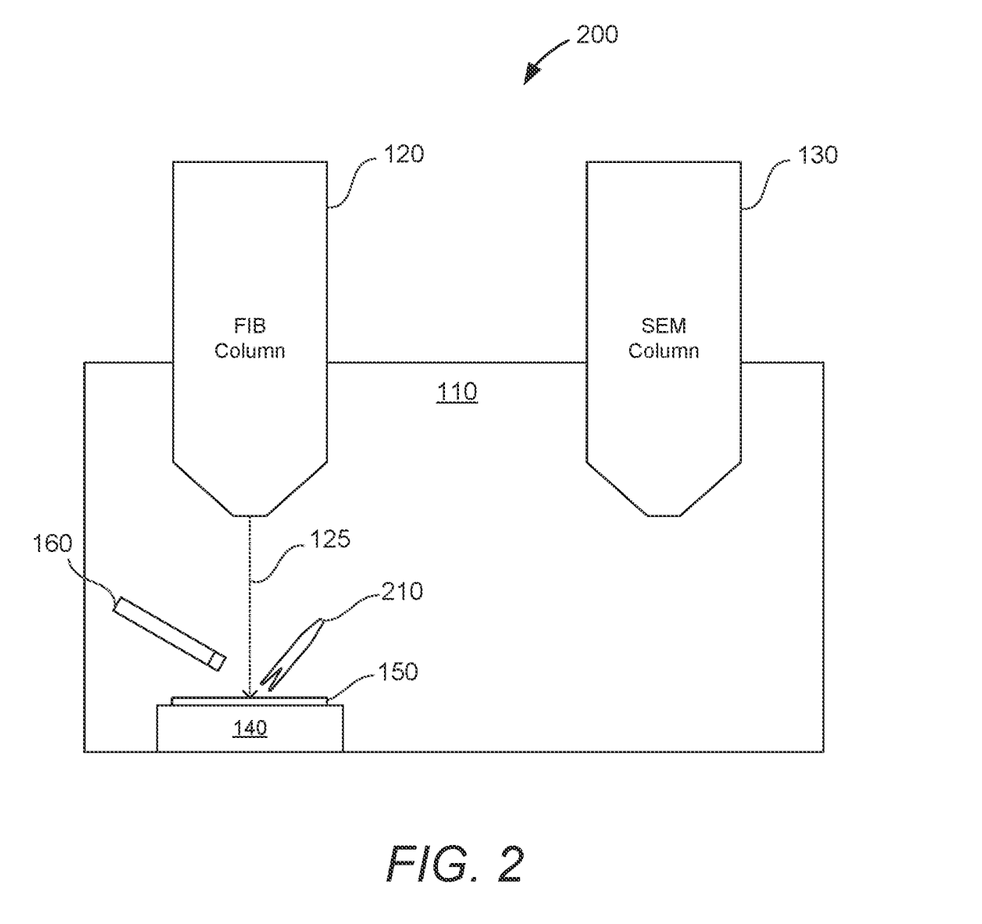
FIG. 2 is a simplified schematic illustration of a sample particle beam deposition system according to some embodiments.

In addition to the various components described above with respect to FIG. 1, substrate processing system 200 can include a temperature controlled, cyro-nanomanipulator 210 that enables precise cooling of a highly localized surface area of sample 150. Unlike some systems that might include a temperature control system that cool the entirety of a sample, cyro-nanomanipulator 210 can cool sample 150 from the top down (i.e., from the upper surface of the sample down) and cools only a relatively small localized surface area on the sample as opposed to cooling the entire sample as is done in some systems. Such localized cooling saves both time and energy during a deposition process enabling a still higher throughput deposition process at reduced cost and does not require a relatively complicated temperature-controlled stage to hold a sample during processing. In some embodiments, cyro-nanomanipulator 210 can include a physical manipulator that can be cooled to a desired temperature and moved to a precise location on the sample 150 under the control of a processor or similar controller, such as processor 170 described above, that controls the operation of system 200.

Figure 3:
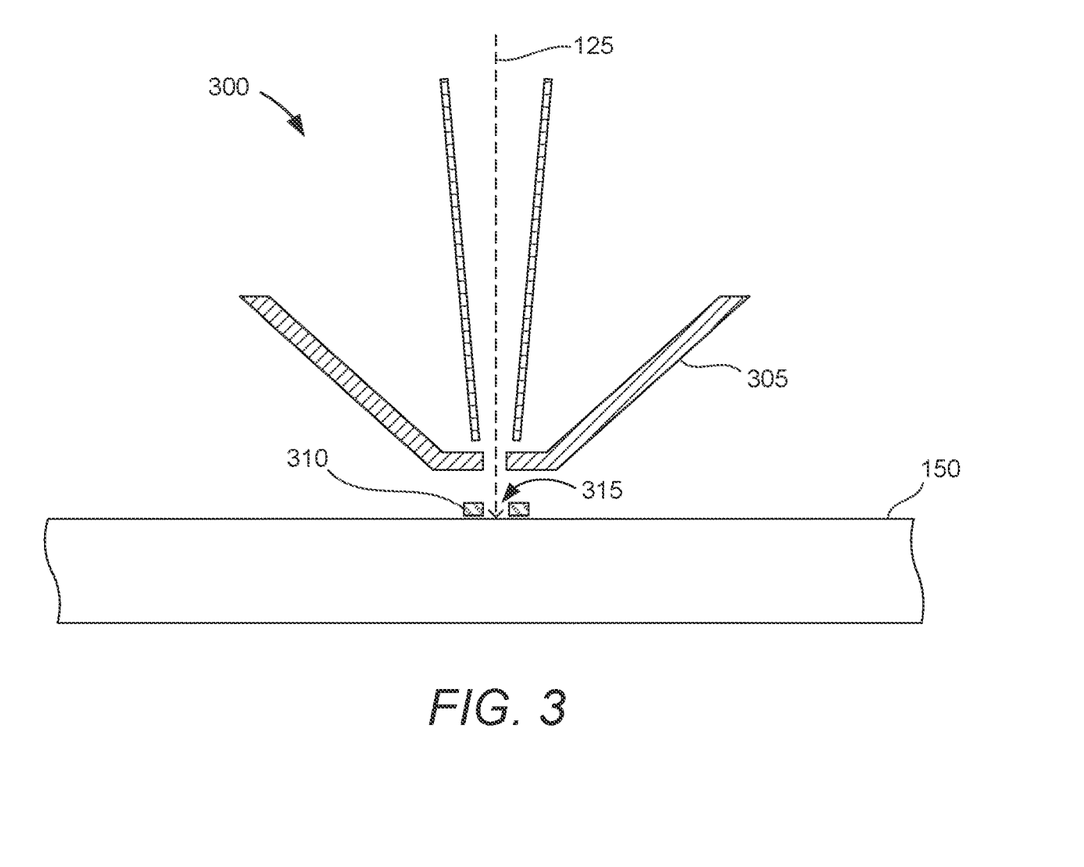
FIG. 3 is a is simplified schematic illustration of a focused ion beam column according to some embodiments

In some embodiments, the cyro-nanomanipulator can be directly coupled to the charged particle column and in some embodiments can surround a periphery of the column tip. To illustrate, reference is made to FIG. 3, which is a simplified schematic illustration of a focused ion beam column 300 that can be representative of FIB column 120. As shown in FIG. 3, FIB column 300 can generate an ion beam 125 that exits the FIB column 300 towards a sample 150 (only a portion of which is shown) through a tip 305 of the column. A cyro-manipulator 310 can be moved into a position such that it is disposed adjacent to tip 305 and adjacent to the region on sample 150 that ion beam 125 is scanned across. When depositing material over a sample, the cyro-nanomanipulator can be moved into physical contact with the sample to enable heat transfer by conduction. In some embodiments the cyro-nanomanipulator 310 can be freely moved within the processing chamber independent of the column and other components, and in some embodiments the cyro-nanomanipulator 310 can be connected to the gas injection system nozzle from below.

In the embodiment depicted in FIG. 3, cyro-nanomanipulator 310 can be a ring-shaped manipulator that includes an inner opening 315 through which ion beam 125 can pass. In some embodiments, opening 315 can be large enough (e.g., between 1-2 mm in diameter) to not interfere with the field of view and deposition area of ion beam 125 and manipulator 310 can have an outer diameter of about 5-10 mm. Thus, the dimensions of cyro-manipulator 310 can be very small compared to the dimensions of column tip 305 (e.g., measured in cm) but very large compared to the scanned area (e.g., measured in microns). Since the manipulator can be moved into physical contact with the sample during a deposition process, the dimensions of the manipulator has a direct impact on that are of the sample that can be cooled.

Figure 4:
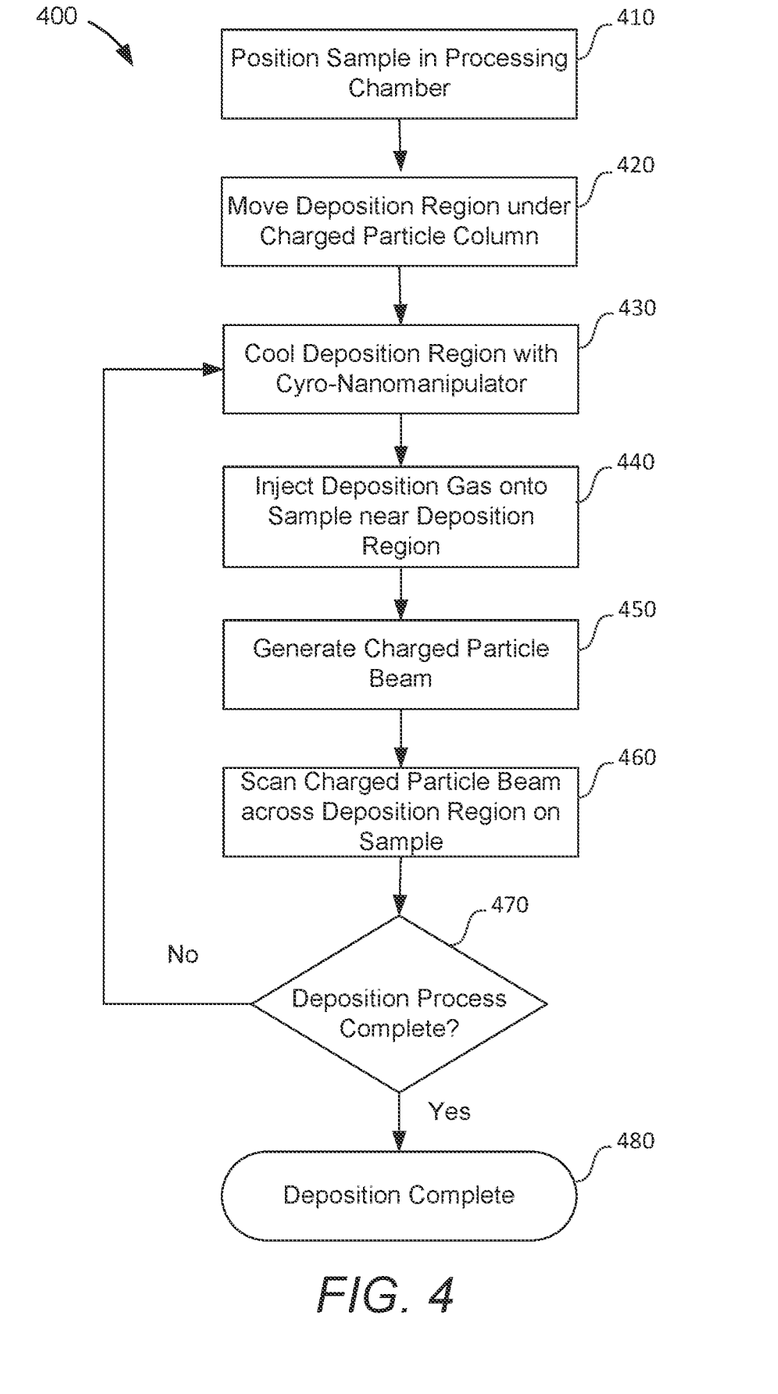
FIG. 4 is a flowchart depicting steps associated with some embodiments set forth in the disclosure.
Figure 5:
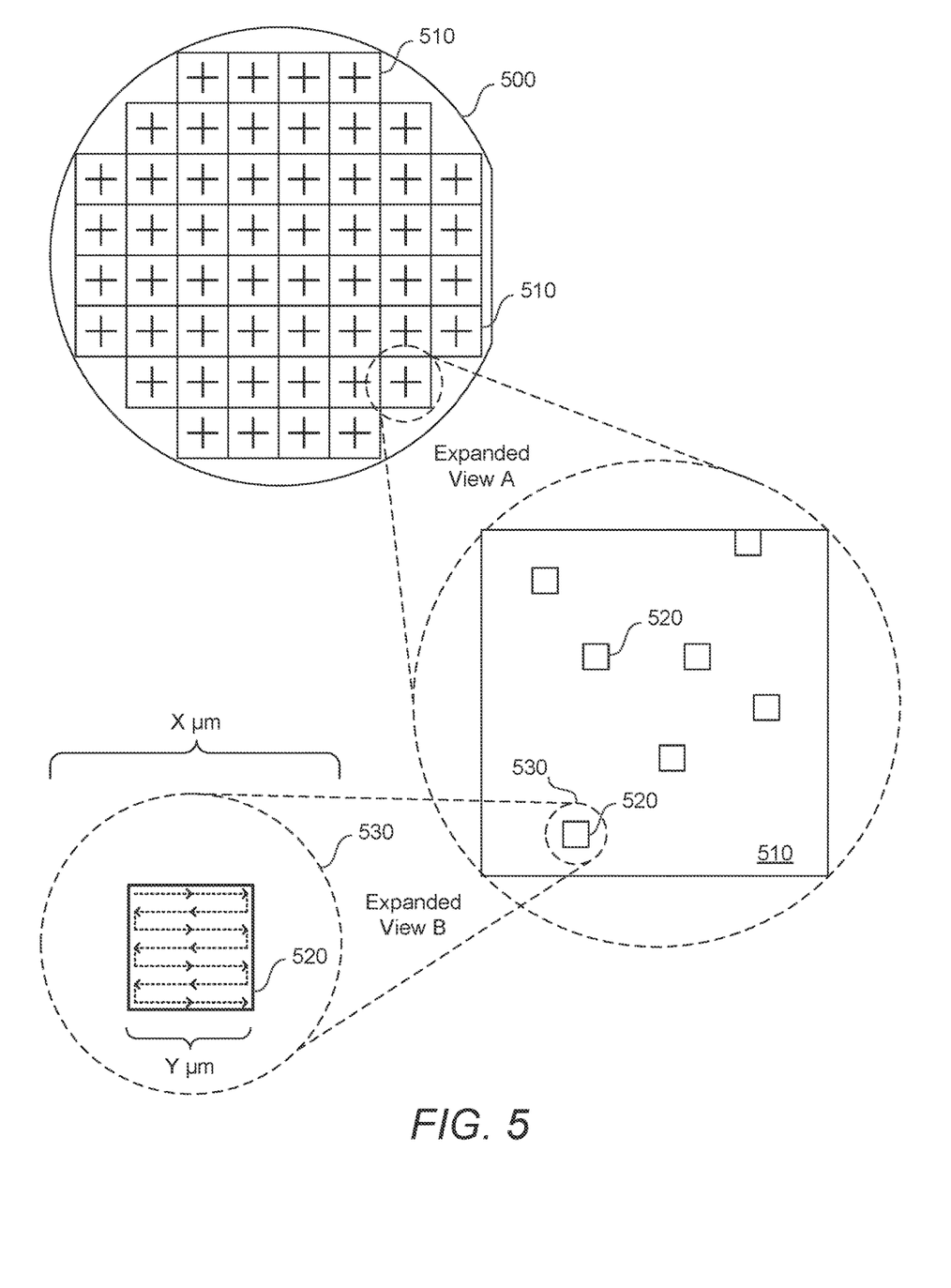
FIG. 5 is a simplified illustration of a semiconductor wafer that can have material deposited thereon via a charged particle beam enhanced deposition process in accordance with some embodiments discussed herein.

To further illustrate embodiments of the disclosure, reference is made to FIGS. 4 and 5 where FIG. 4 is a flowchart depicting steps associated a method 400 according to some embodiments and FIG. 5 is a simplified illustration of a sample 500 that can be representative of sample 150. Material can be deposited on sample 500 via a charged particle beam enhanced deposition process in accordance with method 400. Method 400 starts by positioning a sample within a processing chamber of a sample evaluation system (block 410). The processing chamber, which can be, for example, chamber 110, can include one or more charged particle beam columns that can be operated in a deposition mode to deposit material over the sample 500 in one or more localized regions. Block 410 can include positioning sample 500 within the vacuum chamber on a sample support, such as support 140.

In many instances, sample 500 will include multiple different regions in which material is to be deposited. For example, FIG. 5 depicts a top view of a sample 500 along with two expanded views of specific portions of sample 500. Sample 500 can be, for example, a 200 mm or 300 mm semiconductor wafer and can include multiple integrated circuits 510 (fifty two in the example depicted) formed thereon. The integrated circuits 510 can be at an intermediate stage of fabrication and method 400 can be used to deposit material over one or more regions 520 of the integrated circuits. For example, Expanded View A of FIG. 5 depicts multiple regions 520 of one of the integrated circuits 510 over which material can be deposited according to the techniques described herein. Expanded View B depicts one of those regions 520 in greater detail.

Referring back to FIG. 4, support 140 can be moved to position such that an area in which material is to be deposited over the sample (e.g., one of regions 520, referred to herein as a "deposition region") is placed directly under the tip of the charged particle column (step 420). Next, the deposition region can be cooled with the cyro-nanomanipulator (step 430) and a deposition precursor gas can be injected into the chamber 110 at a location proximate the deposition region by, for example, gas injection system 160 (step 440).

During steps 430, 440 molecules of the deposition precursor gas adhere to the surface of the sample in accordance with the sticking coefficient of the precursor gas. While gas is being delivered to the deposition region and while the deposition region is cooled, the charged particle beam (e.g., an ion beam) can be generated (step 450) and focused and scanned across a region of interest on the sample (step 460). The charged particle beam can be focused by a focusing lens and scanned across a region of the substrate with one or more deflecting lenses (not shown). As discussed above, the cascade of charged particles from beam 125 can activate molecules of the deposition gas that have adhered to the sample in the deposition region resulting in deposition of material on the sample that is localized to the regions of the sample that over which the ion beam is scanned. For example, the charged particle beam can dissociate the precursor gas breaking the gas down into volatile and non-volatile components where the non-volatile component remains on the surface of the sample as deposited material. While embodiments can be used to deposit many different types of materials and are not limited to the use of any particular deposition precursor gas, as one specific example, the deposition precursor gas can be tungsten hexacarbonyl ($W(CO)_6$) that can be dissociated by the charged particle beam leaving a layer of tungsten material deposited on the sample within the localized deposition region.

In actual implementation, steps 450 and 460 can occur essentially simultaneously and very fast and steps 430, 440 can be maintained (i.e., the sample cooled and deposition gas can be introduced into the chamber) while the steps 450 and 460 are performed.

Referring back to FIG. 5, during the deposition process, in some embodiments the cyro-nanomanipulator can cool a portion of the sample that encompasses but is larger than the deposition region. For example, in referring to Expanded Views A and B, cyro-nanomanipulator 310 can cool a portion 530 of the sample within which deposition region 520 is contained. In some embodiments deposition region 530 can be on the order of several hundred microns in diameter or width (X). While the cooled region 530 can be multiple orders of magnitude smaller than the sample itself (e.g., the cooled region can be measured in hundreds of microns while the sample can be measured in hundreds of millimeters), deposition region 520 can be an order or two orders of magnitude smaller still than cooled region 530. For example, in some embodiments deposition region 520 can have a width and/or height (Y) of several microns.

Once material from the precursor gas has been deposited in the first deposition, if there are additional areas on the sample in which material is to be deposited (step 470), the sample can be moved via the substrate support to position a next or subsequent deposition area under the tip of the charged particle column. If not, the deposition process is complete and the sample can be transferred out of system 100 or otherwise processed (step 480).

As noted above, the diffusion coefficient decreases with decreased temperature. Thus, in some instances the diffusion coefficient can reduce or potentially even negate deposition rate benefits that might otherwise be obtained by lowering the surface temperature of the sample in the deposition region. The inventors have found that the diffusion effect, however, can be greatly reduced and have a negligible effect, when large charged particle beams are employed to activate the deposition precursor. Towards this end, some embodiments generate a beam of xenon ions in step 450 that has a much larger beam size than a traditional gallium ion beam. For example, in some embodiments a focused ion beam column can include a xenon plasma source that generates a xenon ion beam having a diameter between 0.5 and 25 microns. The larger beam size of the xenon ion beam can result in a negligible diffusion effect in some deposition processes allowing the reduction in sample temperature in the localized deposition region to result in full benefits of an increased deposition rate.

Additional Embodiments

Any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutatis mutandis to a system that is configured to executing instructions stored in the computer program product.

Where the illustrated embodiments of the present disclosure can, for the most part, be implemented using electronic components and circuits known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

The foregoing description, for purposes of explanation, used specific nomenclature to provide a thorough understanding of the described embodiments. However, it will be apparent to one skilled in the art that the specific details are not required in order to practice the described embodiments.

Thus, the foregoing descriptions of the specific embodiments described herein are presented for purposes of illustration and description. They are not target to be exhaustive or to limit the embodiments to the precise forms disclosed. Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings.

What is claimed is:

1. A method of depositing material over a sample in a deposition region of the sample with a charged particle beam column, the method comprising:
   positioning a sample within a vacuum chamber such that the deposition region is under a field of view of the charged particle beam column;
   cooling the deposition region by contacting the sample with a cryo-nanomanipulator tool in an area adjacent to the deposition region; and
   while the deposition region is cooled with the cryo-nanomanipulator tool:
      injecting a deposition precursor gas into the vacuum chamber at a location adjacent to the deposition region;
      generating a charged particle beam with a charged particle beam column and focusing the charged particle beam on the sample; and
      scanning the charged particle beam across the deposition region of the sample to activate molecules of the deposition gas that have adhered to the sample surface in the deposition region and deposit material on the sample within the deposition region.

2. The method of claim 1 further comprising, after the scanning step, moving the sample such that a new, different deposition region of the sample is positioned under the field of view of the charged particle beam column and repeating the steps of cooling, injecting, generating and scanning to deposit material on the sample within the new deposition region.

3. The method of claim 1 wherein the cryo-nanomanipulator includes an inner ring and the generating and scanning steps direct the charged particle beam through the inner ring of the cryo-nanomanipulator.

4. The method of claim 1 wherein the charged particle column is a focused ion beam column and the charged particle beam is an ion beam.

5. The method of claim 4 wherein the ion beam comprises xenon ions.

6. The method of claim 4 wherein the ion beam has a diameter between 0.5 and 25 microns.

7. The method of claim 1 wherein the vacuum chamber is a chamber in a FIB-SEM tool and the charged particle column is one of a focused ion beam column or a scanning electron microscope column.

8. The method of claim 1 wherein the sample is a semiconductor wafer.

9. A system for depositing material over a sample in a localized deposition region of the sample, the system comprising:
   a vacuum chamber;
   a sample support configured to hold a sample within the vacuum chamber during a sample evaluation process;
   a charged particle beam column configured to direct a charged particle beam into the vacuum chamber toward the sample, the charged particle column including an electron gun at one end of the column and a column cap at an opposite end of the column;
   a cryo-nanomanipulator; and
   a processor and a memory coupled to the processor, the memory including a plurality of computer-readable instructions that, when executed by the processor, cause the system to:
      position a sample within a vacuum chamber such that the deposition region is under a field of view of the charged particle beam column;
      cool the deposition region by contacting the sample with a cryo-nanomanipulator tool in an area adjacent to the deposition region;
      inject a deposition precursor gas into the vacuum chamber at a location adjacent to the deposition region while the deposition region is cooled with the cryo-nanomanipulator tool;
      generate a charged particle beam with a charged particle beam column and focusing the charged particle beam on the sample; and
      scan the charged particle beam across the deposition region of the sample to activate molecules of the deposition gas that have adhered to the sample surface in the deposition region and deposit material on the sample within the deposition region.

10. The system of claim 9 wherein the computer-readable instructions for evaluating a region further comprise instructions that when executed by the processor, cause the system to:
   after the scanning step, move the sample such that a new, different deposition region of the sample is positioned under the field of view of the charged particle beam column; and
   repeat the steps of cooling, injecting, generating and scanning to deposit material on the sample within the new deposition region.

11. The system of claim 9 wherein the cryo-nanomanipulator includes an inner ring and the generating and scanning steps direct the charged particle beam through the inner ring of the cryo-nanomanipulator.

12. The system of claim 9 wherein the charged particle column is a focused ion beam column and the charged particle beam is an ion beam.

13. The system of claim 12 wherein the ion beam comprises xenon ions and has a diameter between 0.5 and 25 microns.

14. The system of claim 9 wherein the sample is a semiconductor wafer.

15. A non-transitory computer-readable memory that stores a plurality of computer-readable instructions for evaluating a region of a sample by:
- positioning a sample within a vacuum chamber such that the deposition region is under a field of view of the charged particle beam column;
- cooling the deposition region by contacting the sample with a cryo-nanomanipulator tool in an area adjacent to the deposition region;
- injecting a deposition precursor gas into the vacuum chamber at a location adjacent to the deposition region while the deposition region is cooled with the cryo-nanomanipulator tool;
- generating a charged particle beam with a charged particle beam column and focusing the charged particle beam on the sample; and
- scanning the charged particle beam across the deposition region of the sample to activate molecules of the deposition gas that have adhered to the sample surface in the deposition region and deposit material on the sample within the deposition region.

16. The non-transitory computer-readable memory of claim 15 wherein the computer-readable instructions for evaluating a region further comprise instructions that:
- after the scanning step, move the sample such that a new, different deposition region of the sample is positioned under the field of view of the charged particle beam column; and
- repeat the steps of cooling, injecting, generating and scanning to deposit material on the sample within the new deposition region.

17. The non-transitory computer-readable memory of claim 15 wherein the cryo-nanomanipulator includes an inner ring and the generating and scanning steps direct the charged particle beam through the inner ring of the cryo-nanomanipulator.

18. The non-transitory computer-readable memory of claim 15 wherein the charged particle column is a focused ion beam column and the charged particle beam is an ion beam.

19. The non-transitory computer-readable memory of claim 18 wherein the ion beam comprises xenon ions and has a diameter between 0.5 and 25 microns.

20. The method of claim 1 wherein the step of cooling the deposition region comprises locally cooling the deposition region with the cryo-nanomanipulator tool from a top of the sample down.

* * * * *